United States Patent
Kim et al.

(10) Patent No.: US 7,473,627 B2
(45) Date of Patent: Jan. 6, 2009

(54) SEMICONDUCTING DEVICE HAVING A STRUCTURE TO IMPROVE CONTACT PROCESSING MARGIN, AND METHOD OF FABRICATING THE SAME

(75) Inventors: Dae Kyeun Kim, Yongin-si (KR); Jeong Ho Park, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 181 days.

(21) Appl. No.: 11/502,060

(22) Filed: Aug. 9, 2006

(65) Prior Publication Data
US 2007/0037354 A1    Feb. 15, 2007

(30) Foreign Application Priority Data
Aug. 12, 2005    (KR)    ............. 10-2005-0074210

(51) Int. Cl.
*H01L 21/3205*    (2006.01)
(52) U.S. Cl. .............. 438/592; 257/382; 257/E21.438; 257/E21.439
(58) Field of Classification Search ......... 438/592, 438/595, 655, 664, 669, 672, 706, 581, 583, 438/618, 630, 651; 257/382, E21.438, E21.439
See application file for complete search history.

(56) References Cited

U.S. PATENT DOCUMENTS 6,146,994 A * 11/2000 Hwang ................... 438/633
6,852,589 B2   2/2005 Huang et al.

OTHER PUBLICATIONS

Chinese Office Action; Chinese Patent Application No. 2006101121225; Dated: Aug. 1, 2008; State Intellectual Property Office of People's Republic of China; People's Republic of China.

* cited by examiner

*Primary Examiner*—Quoc D Hoang
(74) *Attorney, Agent, or Firm*—Andrew D. Fortney

(57) ABSTRACT

A method for fabricating a semiconductor device includes forming a first insulating pattern, a first conductive pattern, and a second conductive pattern on a semiconductor substrate; forming a spacer on sidewalls of the first insulating pattern, the first conductive pattern, and the second conductive pattern; forming a second insulating pattern over the substrate; forming a first salicide on an exposed portion of the substrate and a second salicide on an entire upper surface of the second conductive pattern; depositing a third insulating layer over the substrate, and etching selectively the third insulating layer to forming first and second contact holes exposing the first and second salicides. The method provides processing margin and prevents excessive etching of a conductive layer under the salicide, even if misalignment of an overlying contact hole happens.

16 Claims, 7 Drawing Sheets

SEMICONDUCTING DEVICE HAVING A STRUCTURE TO IMPROVE CONTACT PROCESSING MARGIN, AND METHOD OF FABRICATING THE SAME

This application claims the benefit of Korean Application No. 10-2005-0074210, filed on Aug. 12, 2005, which is incorporated by reference herein in its entirety.

BACKGROUND OF THE INVENTION

1. Field of the Invention

The present invention relates to a semiconductor device and a fabrication method thereof, and more specifically, to a semiconductor device having a structure to improve contact processing margin and a method for fabricating the same.

2. Description of the Related Art

A short interval between a contact and a non-salicide region may cause insufficient processing margin when fabricating a semiconductor device, including SRAM devices. Misalignment resulting from the insufficient processing margin at a contact forming step may cause excessive etching of a lower conductive layer. Such excessive etching of a conductive layer may adversely affect a leakage current property so that performance and/or yield of a semiconductor device may decrease.

FIG. 1 shows a portion of layout of a conventional 1T-SRAM. As shown in FIG. 1, a reference number 11 points to an active area, numbers 31 and 32 refer a first and a second conductive patterns comprising, for example, polysilicon. Number 51 refers to an insulating layer (defining a non-salicide area), and numbers 81 and 82 point to a first contact and a second contact. As shown in FIG. 1, a short interval or distance (A) between the second contact 82 and a non-salicide region 51 often causes insufficient processing margin on fabricating a semiconductor device including SRAM.

FIG. 2 shows a cross-sectional view along the II-II line of FIG. 1. As shown in FIG. 2, a first insulating pattern 21, a first conductive pattern 31 and a second conductive pattern 32 are formed on a semiconductor substrate 10. A spacer 40 is formed on a sidewall of those patterns. A second insulating pattern 51, in a non-salicide region, is over the first conductive layer 31, part of the second conductive layer 32, the spacers 40, and the exposed substrate between the spacers 40.

A first salicide 61 is on the exposed substrate in the right side of the second conductive layer 32. A second salicide 62 is also formed on the second conductive layer 32. A first contact 81 and a second contact 82 formed by etching a third insulating layer 71 are on the first salicide 61 and the second salicide 62, respectively. Here, an interval between a non-salicide region defined by the second insulating pattern 51 and the second contact 82 connected to the second salicide layer 62 on the second conductive layer 32 may be insufficient to provide a desired level of process margin. A short distance "A" between the second contact 82 and the non-salicide region 51 may cause a serious problem when misalignment happens at a contact etching step.

FIG. 3 is a sectional view showing a problem according to a conventional semiconductor device. As shown in FIG. 3, the second conductive pattern 32 in a non-salicide region may be excessively etched if misalignment happens. In the device of FIG. 3, the contact hole 82 is formed over both silicide layer 62 and insulating layer 51 defining the non-salicide region. Etching of the contact hole 82 stops on the silicide layer 62, but etches through insulating layer 51 and the underlying portion of polysilicon gate 32. As a result, it can be seen that excessive etching of a conductive layer adversely affects a leakage current property of the device so that performance and/or yield of the device drops.

SUMMARY OF THE INVENTION

It is, therefore, an object of the present invention to obtain processing margin and prevent excessive etching of a conductive layer under a salicide, even if misalignment of an overlying contact hole happens.

Another object of the present invention is to increase performance and/or yield of a semiconductor device by improving a leakage current property (or reducing the probability of leakage current-increasing events) and obtaining a stable resistance property of a conductive layer.

To achieve the above objects, an embodiment of a method for fabricating a semiconductor device according to the present invention comprises the steps of: (a) etching a first insulating layer and a conductive layer on a semiconductor substrate to form a first insulating pattern, a first conductive pattern, and a second conductive pattern; (b) forming a spacer on sidewall of the first insulating pattern, the first conductive pattern, and the second conductive pattern; (c) depositing a second insulating layer over an entire surface of the substrate including the first insulating pattern and the first and second conductive patterns, and dry-etching the second insulating layer (e.g., using a photoresist pattern) to form a second insulating pattern; (d) eliminating the photoresist pattern (if necessary or desired) and forming a first salicide on an exposed substrate and a second salicide on an entire upper surface of the second conductive pattern; and (e) depositing a third insulating layer over an entire surface of the substrate including the first and second insulating pattern and the first and second conductive patterns, and forming a first contact hole and a second contact hole (e.g., by selectively etching the third insulating layer), respectively exposing the first salicide and the second salicide. It is preferable that the second insulating pattern is formed to expose the entire upper surface of the second conductive pattern, and the second salicide layer covers an entire upper surface of the second conductive pattern.

According to the present invention, it is desirable that the second contact is separated from the second insulating pattern by a predetermined distance. Preferably, the distance is in the range of 60 nm~100 nm.

According to the present invention, the second insulating layer may comprise LP-TEOS or PE-TEOS. Preferably, the second insulating layer can have a thickness of 600 Å~900 Å. Also, the first salicide and the second salicide can comprise Ta silicide, Co silicide, or Ni silicide.

A semiconductor device according to the present invention comprises: (a) a first insulating pattern, a first conductive pattern, and a second conductive pattern on a semiconductor substrate, (b) a spacer on sidewalls of the first insulating pattern, the first conductive pattern, and the second conductive pattern, (c) a second insulating pattern on the spacer and the first conductive pattern, exposing an entire upper surface of the second conductive pattern, (d) a first salicide on the exposed substrate and a second salicide on an entire upper surface of the second conductive pattern, and (e) a third insulating layer on the second insulating pattern and the first and second salicides, and (f) first and second contact holes, respectively exposing the first salicide and the second salicide.

This and other aspects of the invention will become evident by reference to the following description of the invention, often referring to the accompanying drawings.

DETAILED DESCRIPTION OF THE INVENTION

To clarify the present invention, techniques known widely to the corresponding technical filed and not directly related to the present invention are not shown in this description. Some components are omitted, exaggerated or proximately illustrated in the accompanying drawings for the same reason, and thus, a component's size as shown in the accompanying Figures does not always reflect reality.

Figure 1:
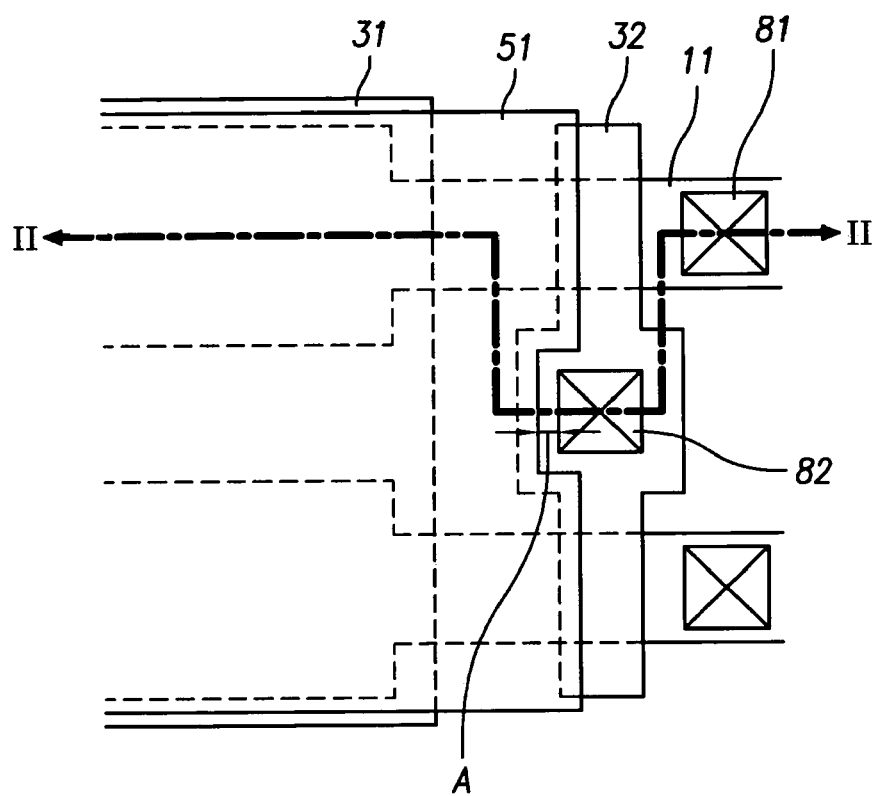
FIG. 1 is a layout of a conventional semiconductor device.
Figure 2:
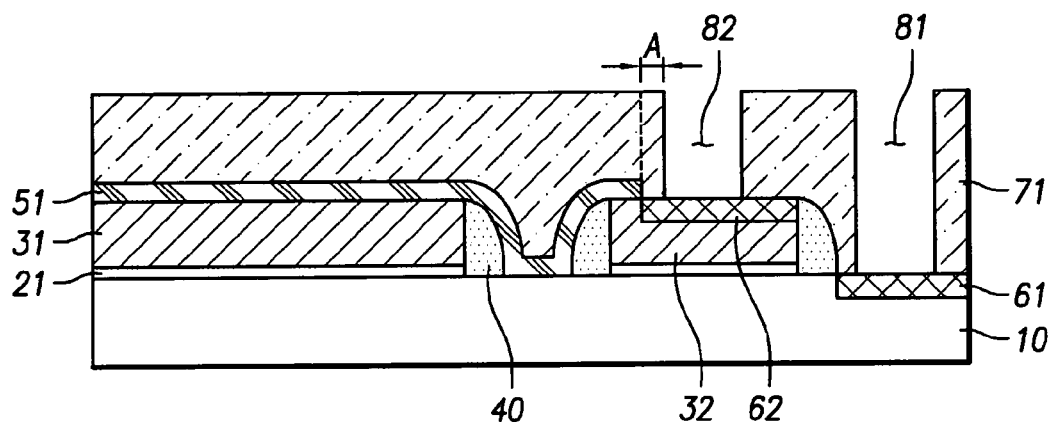
FIG. 2 is a cross-sectional view along line II-II of FIG. 1.
Figure 3:
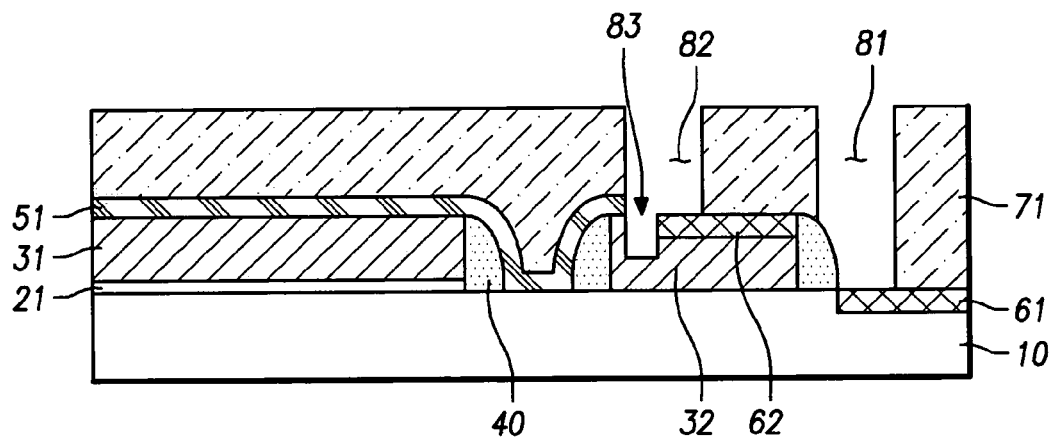
FIG. 3 is a cross-sectional view showing a problem according to a conventional semiconductor device.
Figure 4:
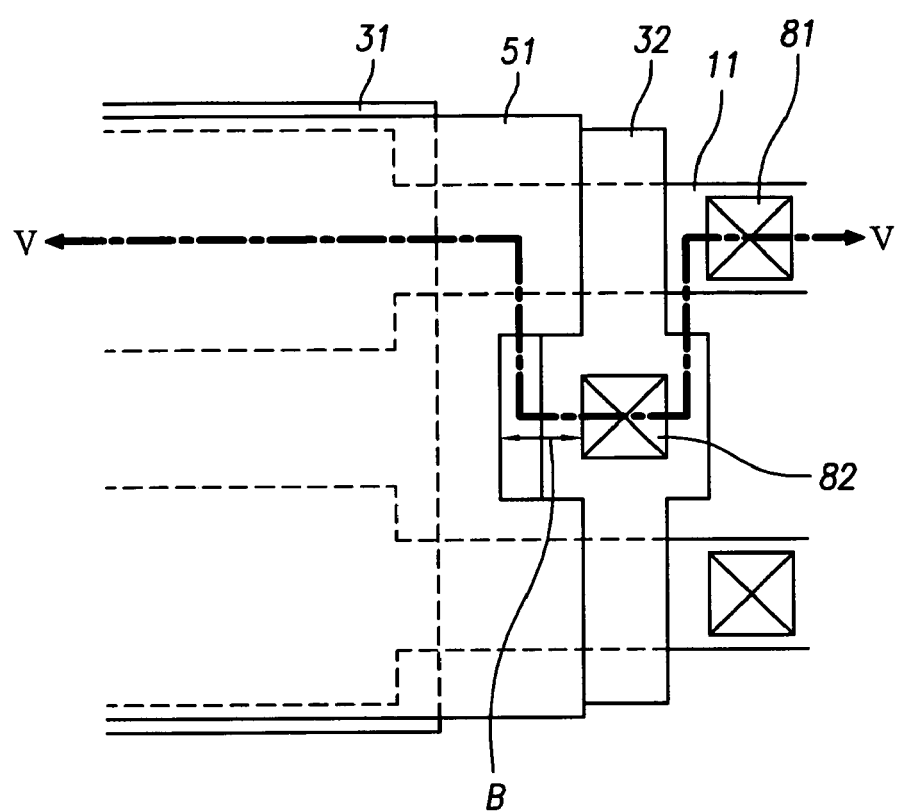
FIG. 4 is a layout of a semiconductor device according to an embodiment of the present invention.

FIG. 4 shows a part of layout of a semiconductor device (1T-SRAM) according to an embodiment of the present invention. Parts of the semiconductor device layout are common in FIG. 4 and FIG. 1, so that reference numbers used in FIG. 4 correspond to those in FIG. 1. As shown in FIG. 4, an interval or distance ("B") between the non-salicide region 51 and the second contact 82 connecting to the second conductive pattern 32 is sufficient to perform a following process and provide sufficient or adequate processing margin at a contact-etching step. It is preferable that the interval (B) is 60 nm or more, more preferably 60 nm~100 nm.

Figure 5A:
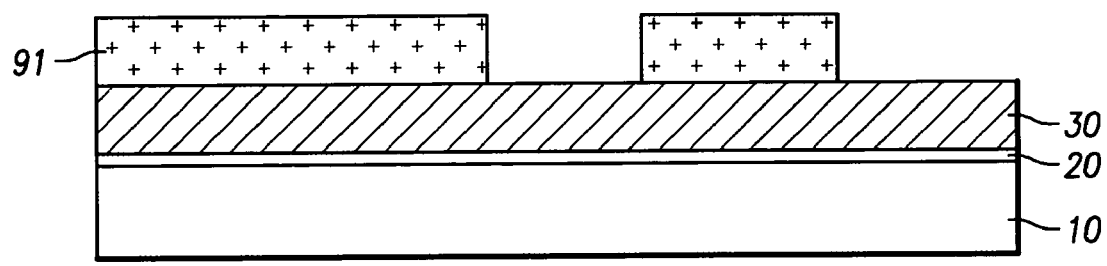
FIGS. 5a to 5f are a cross-sectional view along line V-V of FIG. 4, which shows in a successive order a method for fabricating a semiconductor device according to an embodiment of the present invention.

FIGS. 5a to 5f are a sectional view along a line V-V in FIG. 4. FIGS. 5a to 5f show a method for forming a semiconductor device according to the present invention. As shown in FIG. 5a, a first insulating layer 20 and a conductive layer 30 are formed on a semiconductor substrate 10. First insulating layer 20 may comprise or consist essentially of a gate oxide layer, for example, and conductive layer 30 may comprise or consist essentially of polysilicon, which may be (heavily) doped with one or more conventional dopants. After forming a first photoresist pattern 91 on a conductive layer 30, the conductive layer 30 and the first insulating layer 20 are in successive order dry-etched using the first photoresist pattern 91 as a mask.

Figure 5B:
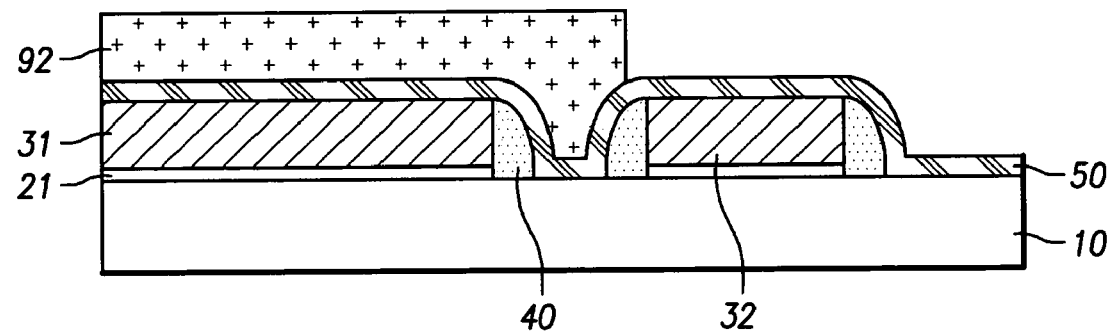

FIG. 5b shows the first insulating pattern 21, the conductive pattern 31 and the second conductive pattern 32 resulting from the above etching. After eliminating the first photoresist pattern, one or more layers for a spacer (e.g., silicon dioxide and/or silicon nitride, such as a nitride-on-oxide bilayer) are deposited and etched to form a spacer 40 on sidewalls of the first insulating pattern 21, the first conductive pattern 31, and the second conductive pattern 32 using anisotropic etching. Subsequently, a second insulating layer 50 is deposited on an entire upper surface of the device, and then a second photoresist pattern 92 is formed on the second insulating layer 50. It is preferable that the second insulating layer 50 comprises LP-TEOS or PE-TEOS. More preferably, a thickness of the second insulating layer is at least 60 Å☐, more preferably 60 Å☐~100 Å☐.

Figure 5C:
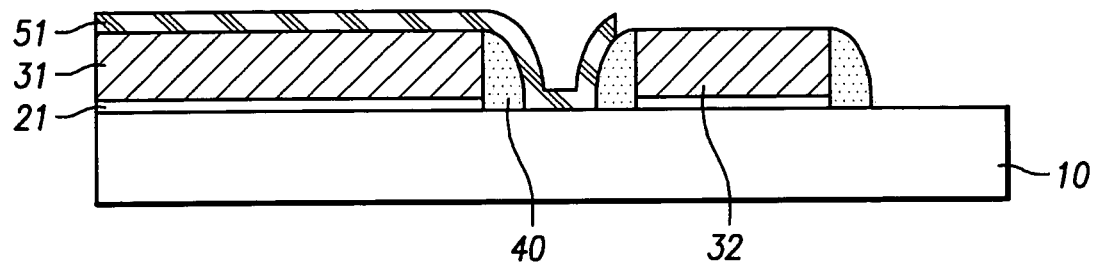

As shown in FIG. 5c, a second insulating pattern 51 is formed by dry-etching the second insulating layer 50 using the second photoresist pattern 92 as a mask. After etching, the second photoresist pattern is eliminated. Especially, the second insulating pattern 51 should be formed to expose an entire upper surface of the second conductive pattern 32.

Figure 5D:
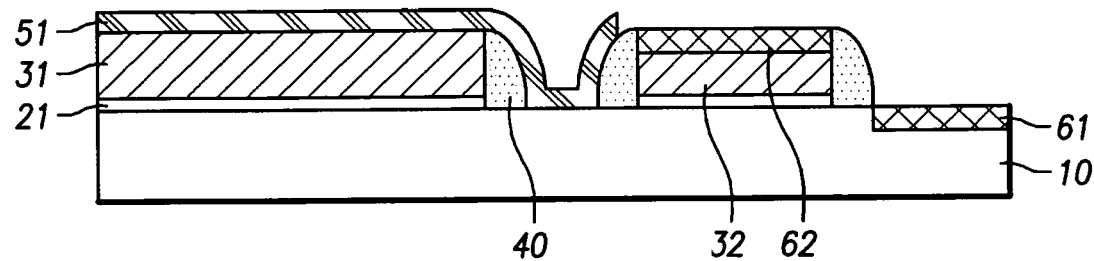

As shown in FIG. 5d, a first salicide 61 and a second salicide 62 are respectively formed on an upper surface of the second conductive pattern 32 and a semiconductor substrate 10 exposed when the second insulating pattern 51 is formed. Such salicide processing comprises a metal sputtering deposition step and an annealing step. It is preferable that the metal for the first salicide and the second salicide comprises Ta, Co, or Ni. As a result, the first and second salicides 61-62 preferably comprise tantalum (Ta) silicide, cobalt (Co) silicide, or nickel (Ni) silicide, although other silicides such as titanium (Ti) silicide, molybdenum (Mo) silicide or tungsten (W) silicide may also be suitable. The upper surface of the conductive pattern 32 is entirely exposed so that the second salicide 62 can cover the entire upper surface of the second conductive pattern.

Figure 5E:
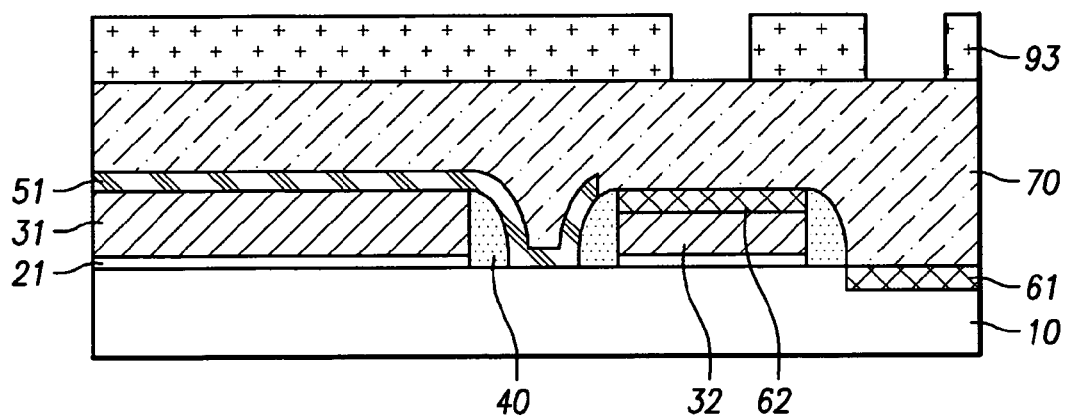

As shown in FIG. 5e, after depositing a third insulating layer 70, a third photoresist pattern 93 is formed on the third insulating layer 70. Subsequently, the third insulating layer 70 is dry-etched using the third photoresist pattern 93 as a mask.

Figure 5F:
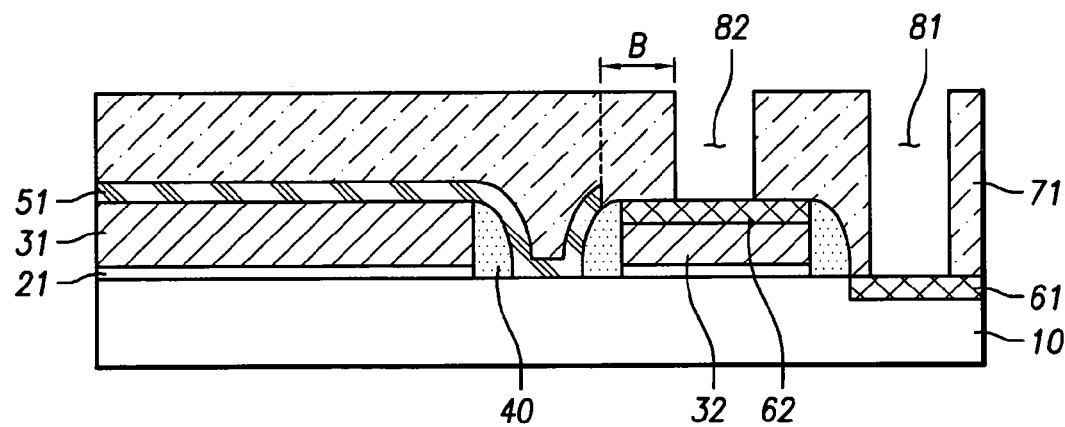

As shown in FIG. 5f, the third insulating pattern 71, the first contact hole 81, and the second contact hole 82 result from the above etching. The first contact hole 81 and the second contact hole 82 expose the first salicide 61 and the second salicide 62. Here, an interval (B) between the second contact hole 82 and the second insulating pattern 51 is sufficient to provide a predetermined processing margin at a contact-etching step. It is preferable that the interval (B) is more than 60 nm, more preferably 60 nm~100 nm, e.g., in a 1T-SRAM device. Subsequently, first and second contacts may be formed in the first and second contact holes 81 and 82 to connect overlying metallization (e.g., first and second metal lines) with the first salicide 61 and the second salicide 62. The contacts may comprise a conventional tungsten plug, which may further comprise a conventional titanium adhesive layer and/or a conventional titanium nitride barrier layer.

Figure 6:
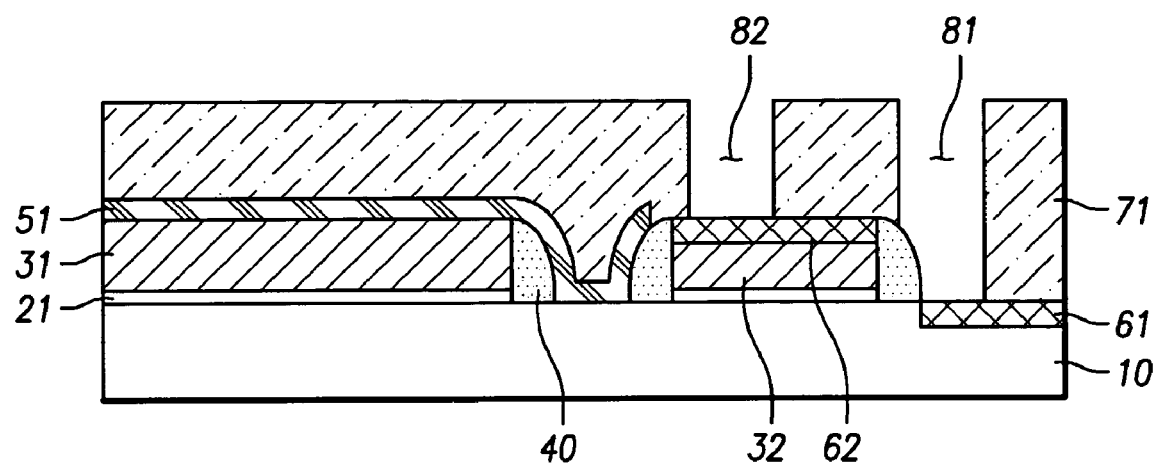
FIG. 6 is a cross-sectional view showing an effect of a semiconductor device according to an embodiment of the present invention.

FIG. 6 shows the effect of a semiconductor device according to an embodiment of the present invention. As shown in FIG. 6, even though misalignment happens (note exposure of sidewall spacer 40 adjacent to the first salicide 61), the second salicide 62 covers entirely the second conductive pattern 32 so that the second conductive pattern 32 can be protected and excessive etching prevented at a contact-etching step. According to the present invention, the leakage current property of a semiconductor device can be improved. Performance and yield of a semiconductor device can also be improved.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. Method for fabricating a semiconductor device, comprising the steps of:
   (a) forming a first insulating pattern, a first conductive pattern, and a second conductive pattern on a semiconductor substrate;
   (b) forming a spacer on sidewalls of the first insulating pattern, the first conductive pattern, and the second conductive pattern;
   (c) depositing a second insulating layer over an entire surface of the substrate including the first insulating pattern and the first and second conductive patterns, and forming a second insulating pattern from the second insulating layer exposing an entire upper surface of the second conductive pattern;

(d) forming a first salicide on an exposed substrate and a second salicide on an entire upper surface of the second conductive pattern; and (e) depositing a third insulating layer over an entire surface of the substrate including the first and second insulating patterns and the first and second conductive patterns, and forming a first contact hole and a second contact hole, respectively exposing the first salicide layer and the second salicide layer, wherein the second contact hole is a predetermined distance from the second insulating pattern and the predetermined distance is more than 60 nm.

2. The method according to claim 1, wherein the predetermined distance is in the range of 60 nm~100 nm.

3. The method according to claim 1, wherein the second insulating layer comprises LP-TEOS or PE-TEOS.

4. The method according to claim 1, wherein the second insulating layer has a thickness of 600 Å~900 Å.

5. The method according to claim 1, wherein the first and second salicides comprise Ta silicide, Co silicide, or Ni silicide.

6. The method according to claim 1, wherein forming the first insulating pattern and the first and second conductive patterns comprises selectively etching a first insulating layer and a conductive layer on the semiconductor substrate.

7. The method according to claim 6, wherein forming the second insulating pattern comprises dry-etching the second insulating layer using a photoresist pattern as a mask.

8. The method according to claim 7, further comprising eliminating the photoresist pattern.

9. The method according to claim 8, wherein forming the first and second contact holes comprises etching selectively the third insulating layer.

10. The method according to claim 1, further comprising forming first and second contacts in the first and second contact holes, connected to the first salicide layer and the second salicide layer, respectively.

11. A semiconductor device comprising:
(a) a first insulating pattern, a first conductive pattern, and a second conductive pattern on the semiconductor substrate;
(b) a spacer on sidewalls of the first insulating pattern, the first conductive pattern, and the second conductive pattern;
(c) a second insulating pattern on the spacer and the first and second conductive patterns, the second insulating pattern exposing an entire upper surface of the second conductive pattern;
(d) a first salicide on the exposed substrate and a second salicide on an entire upper surface of the second conductive pattern;
(e) a third insulating layer on the second insulating pattern and the first and second salicides; and
(f) first and second contact holes exposing the first salicide and the second salicide, respectively, wherein the second contact hole is a predetermined distance from the second insulating pattern and the predetermined distance is more than 60 nm.

12. The semiconductor device according to claim 11, wherein the predetermined distance is in the range of 60 nm~100 nm.

13. The semiconductor device according to claim 11, wherein the second insulating layer comprises LP-TEOS or PE-TEOS.

14. The semiconductor device according to claim 11, wherein the second insulating layer has a thickness of 600 Å~900 Å.

15. The semiconductor device according to claim 11, wherein the first and second salicides comprise Ta silicide, Co silicide, or Ni silicide.

16. The semiconductor device according to claim 11, further comprising first and second contacts in the first and second contact holes, connected to the first salicide layer and the second salicide layer, receptively.

* * * * *